United States Patent
Jung et al.

(10) Patent No.: US 9,653,133 B2
(45) Date of Patent: May 16, 2017

(54) SEMICONDUCTOR DEVICE AND SEMICONDUCTOR SYSTEM

(71) Applicant: SK hynix Inc., Icheon-si, Gyeonggi-do (KR)

(72) Inventors: Chul Moon Jung, Icheon-si (KR); Mun Phil Park, Seoul (KR); Seok Cheol Yoon, Seoul (KR); Jeong Tae Hwang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 14/951,852

(22) Filed: Nov. 25, 2015

(65) Prior Publication Data
US 2017/0084321 A1    Mar. 23, 2017

(30) Foreign Application Priority Data

Sep. 23, 2015    (KR) .................. 10-2015-0134996

(51) Int. Cl.
*G11C 8/18*    (2006.01)
*G11C 8/10*    (2006.01)

(52) U.S. Cl.
CPC . *G11C 8/18* (2013.01); *G11C 8/10* (2013.01)

(58) Field of Classification Search
CPC .................................... G11C 8/18; G11C 8/12
USPC .................................. 365/203, 194, 230.03
See application file for complete search history.

(56) References Cited

U.S. PATENT DOCUMENTS

| 2007/0038804 | A1  | 2/2007 | Nierle et al. |
| 2010/0141309 | A1* | 6/2010 | Lee .................. G11C 11/406 327/142 |
| 2012/0188839 | A1* | 7/2012 | Hwang .............. G11C 8/12 365/230.06 |
| 2015/0009768 | A1* | 1/2015 | Jang .................. G11C 11/4076 365/194 |
| 2015/0043297 | A1* | 2/2015 | Hong .................. G11C 8/18 365/230.03 |
| 2016/0035400 | A1* | 2/2016 | Lee .................. G11C 7/109 365/230.03 |

FOREIGN PATENT DOCUMENTS

KR    1020090066908 A    6/2009

* cited by examiner

*Primary Examiner* — Hoai V Ho
*Assistant Examiner* — Jay Radke
(74) *Attorney, Agent, or Firm* — William Park & Associates Ltd.

(57) ABSTRACT

A semiconductor system may include a command processor configured to decode a command to generate an active pulse and a delayed active pulse, and a bank active signal generation circuit configured to generate a bank active signal for performing an active operation for a bank accessed by an address. The bank active signal may be disabled in synchronization with the active pulse and is enabled in synchronization with the delayed active pulse.

21 Claims, 8 Drawing Sheets

SEMICONDUCTOR DEVICE AND SEMICONDUCTOR SYSTEM

CROSS-REFERENCES TO RELATED APPLICATION

The present application claims priority under 35 U.S.C. §119(a) to Korean application number 10-2015-0134996, filed on Sep. 23, 2015, in the Korean Intellectual Property Office, which is incorporated herein by reference in its entirety.

BACKGROUND

1. Technical Field

Various embodiments generally relate to a semiconductor device and a semiconductor system configured to generate an active signal.

2. Related Art

In general, a semiconductor device can perform an active operation and a precharge operation. The active operation decodes a row address to select a memory cell array, and amplifies data of the selected memory cell array to achieve a state in which a column operation is possible. A precharge operation achieves a state before an active operation is performed such that a next active operation is possible.

Recently, as a semiconductor device having a four or eight bank structure is generalized, when an active operation is performed, a bank active signal generation circuit decodes a row address to generate a bank active signal, thereby selecting a bank in which an active operation is performed from a plurality of banks. After the bank is selected, a word line driving circuit decodes the row address to activate a specific main word line and a sub-word line included in the selected bank, thereby selecting a memory cell array. Among semiconductor devices, a combo-type semiconductor device supports both a 2-bit prefetch scheme of simultaneously processing 2-bit data and a 4-bit prefetch scheme of simultaneously processing 4-bit data.

In a semiconductor device, a write operation should be completed until a precharge operation starts after the write operation starts. This operation period is called a write recovery time (tWR).

DETAILED DESCRIPTION

Figure 1:
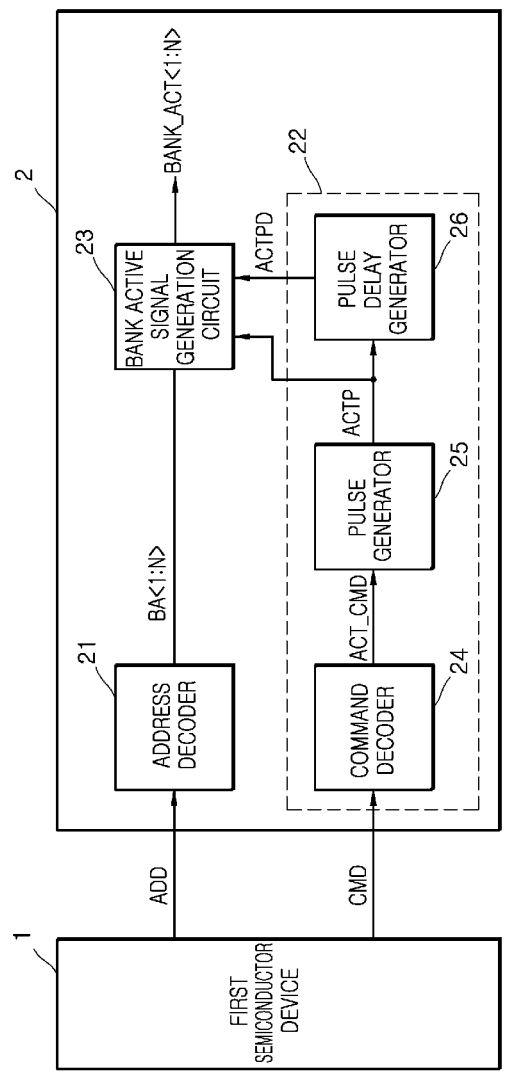
FIG. 1 is a block diagram illustrating a representation of an example of a configuration of a semiconductor system in accordance with an embodiment.

Various embodiments may be directed to a semiconductor device and a semiconductor system, by which it may be possible to adjust a precharge operation period and an active operation period.

In an embodiment, a semiconductor device may be provided. The semiconductor device may include a command processor configured to decode a command to generate an active pulse and a delayed active pulse. The semiconductor device may include a bank active signal generation circuit configured to generate a bank active signal for performing an active operation for a bank accessed by an address. The bank active signal may be disabled in synchronization with the active pulse and may be enabled in synchronization with the delayed active pulse.

In an embodiment, a semiconductor device may be provided. The semiconductor device may include a command processor configured to decode a command to generate an active pulse, a first delayed active pulse, and a second delayed active pulse. The semiconductor device may include a block active signal generation circuit configured to generate a block active signal in response to the active pulse in a state in which a preset block has been accessed. The block active signal may be enabled in response to a first pulse of the active pulse and may be disabled in response to a second pulse of the active pulse.

In an embodiment, a semiconductor system may be provided. The semiconductor system may include a first semiconductor device configured to output an address and a command. The semiconductor system may include a second semiconductor device configured to generate a block active signal in response to an active pulse generated by decoding the command in a state in which a preset block has been accessed in response to the address. The block active signal may be enabled in response to a first pulse of the active pulse and may be disabled in response to a second pulse of the active pulse.

In an embodiment, a semiconductor device may be provided. The semiconductor device may include a command processor configured to decode a command to generate an active pulse and a delayed active pulse, and a bank active signal generation circuit configured to generate a bank active signal for performing an active operation for a bank accessed by an address. When the active operation is performed for an accessed bank, a percharge operation may be performed for the accessed bank during only a period from a time at which the active pulse is generated to a time at which the delayed active pulse is generated.

In an embodiment, a semiconductor device may be provided. The semiconductor device may include a command processor configured to decode a command to generate an active pulse, a first delayed active pulse, and a second delayed active pulse, and a block active signal generation circuit configured to generate a block active signal in response to the active pulse in a state in which a preset block has been accessed. When an active operation is performed from a time at which a first active operation is performed for an accessed block to a time at which a second active operation is performed, a precharge operation may be performed during only a preset period from the time at which the second active operation is performed.

According to the embodiments, a precharge operation period for a block or a bank including a plurality of memory cell arrays can be reduced and an active operation period can be increased, so that it may be possible to sufficiently ensure a write recovery time.

Hereinafter, a semiconductor device and a semiconductor system will be described below with reference to the accompanying drawings through various examples of embodiments.

Referring to FIG. 1, a semiconductor system in accordance with an embodiment may include a first semiconductor device 1 and a second semiconductor device 2.

The first semiconductor device 1 may apply an address ADD and a command CMD to the second semiconductor device 2. In an embodiment, the address ADD and the command CMD are illustrated to be transmitted through separate lines, but may also be implemented to be transmitted through substantially the same line in accordance with embodiments.

The second semiconductor device 2 may include an address decoder 21, a command processor 22, and a bank active signal generation circuit 23.

The address decoder 21 may decode the address ADD to generate bank access signals BA<1:N>. Logic level combinations of the bank access signals BA<1:N> may be set in order to access banks included in the second semiconductor device 2. The number of banks included in the second semiconductor device 2 may be variously set in accordance with embodiments, and it may be preferable that a bit number "N" of the bank access signals BA<1:N> is decided according to the number of banks. The address ADD may be implemented as a signal including a plurality of bits in accordance with embodiments. In an embodiment, an example, in which the address decoder 21 decodes the address ADD to generate the bank access signals BA<1:N> in order to access a bank, has been described; however, the address decoder 21 may also be implemented to generate a signal for accessing various memory cell arrays called a block included in a bank, and the like, in accordance with embodiments.

The command processor 22 may receive the command CMD to generate an active pulse ACTP and a delayed active pulse ACTPD. The active pulse ACTP may include a pulse generated for an active operation for banks accessed by the bank access signals BA<1:N>. The delayed active pulse ACTPD may be generated by delaying the active pulse ACTP by a preset delay period.

The bank active signal generation circuit 23 may generate bank active signals BANK_ACT<1: N> in order to perform the active operation for the banks accessed by the bank access signals BA<1:N>. For example, in the state in which a bank access signal BA<k> has been enabled to a logic high level and an K$^{th}$ bank has been accessed, when an active command ACT_CMD is enabled, a bank active signal BANK_ACT<k> for activating the K$^{th}$ bank may be disabled in synchronization with the active pulse ACTP and may be enabled in synchronization with the delayed active pulse ACTPD.

The command processor 22 may include a command decoder 24, a pulse generator 25, and a pulse delay generator 26. The command decoder 24 may decode the command CMD to generate the active command ACT_CMD. The active command ACT_CMD may be set as a signal which is enabled in order to perform the active operation. The command CMD may be implemented as a signal including a plurality of bits in accordance with embodiments. A logic level and a period at/in which the active command ACT_CMD is enabled may be variously set in accordance with embodiments. The pulse generator 25 may generate the active pulse ACTP including pulses generated in synchronization with the time points at which the active command ACT_CMD is enabled. The active pulse ACTP may include a pulse corresponding to the number of times by which the active command ACT_CMD is enabled. The pulse delay generator 26 may generate the delayed active pulse ACTPD by delaying the active pulse ACTP by a preset delay period. The delay period, in which the active pulse ACTP is delayed, may be variously set in accordance with embodiments.

Figure 2:
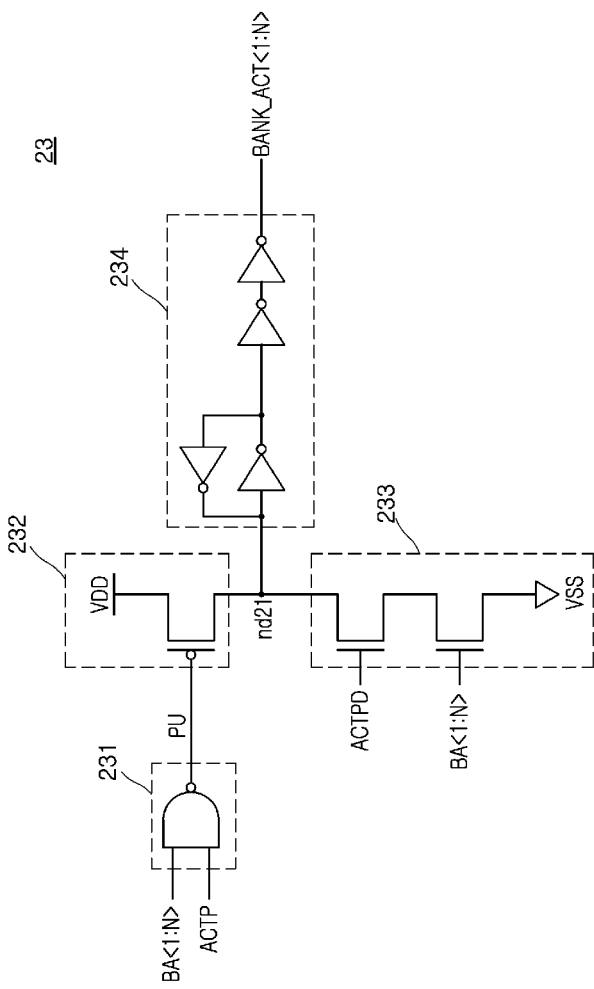
FIG. 2 is a circuit diagram representation of an example in accordance with an embodiment of a bank active signal generation circuit included in a semiconductor system illustrated in FIG. 1.

Referring to FIG. 2, the bank active signal generation circuit 23 may include a pull-up signal generation circuit 231, a pull-up driving circuit 232, a pull-down driving circuit 233, and a latch output circuit 234.

The pull-up signal generation circuit 231 may generate a pull-up signal PU in response to the bank access signals BA<1:N> and the active pulse ACTP. In the state in which the bank access signals BA<1:N> have been enabled, when a pulse of the active pulse ACTP is generated, the pull-up signal generation circuit 231 may generate a pull-up signal PU which may be enabled to a logic low level. In an embodiment, for example, the pull-up signal generation circuit 231 may include a logic circuit configured to receive the bank access signals BA<1:N> and the active pulse ACTP and output the pull-up signal PU. In an embodiment, for example, the pull-up signal generation circuit 231 may include a NAND gate configured to receive the bank access signals BA<1:N> and the active pulse ACTP and output the pull-up signal PU.

The pull-up driving circuit 232 may pull-up drive a node nd21 in response to the pull-up signal PU. When the pull-up signal PU is enabled to a logic low level, the pull-up driving circuit 232 may drive the node nd21 with a power supply voltage VDD.

The pull-down driving circuit 233 may pull-down drive the node nd21 in response to the bank access signals BA<1:N> and the delayed active pulse ACTPD. In the state in which the bank access signals BA<1:N> have been enabled, when a pulse of the delayed active pulse ACTPD is generated, the pull-down driving circuit 233 may drive the node nd21 with a ground voltage VSS.

The latch output circuit 234 may generate the bank active signals BANK_ACT<1:N> in response to a signal of the node nd21 (i.e., internal node). The latch output circuit 234 may latch, invert, and buffer the signal of the node nd21 to generate the bank active signals BANK_ACT<1:N>.

Referring to FIG. 2, the bank active signal generation circuit 23 is illustrated as one circuit, but may be implemented as separate circuits according to bits of the bank access signals BA<1:N> and the bank active signals BANK_ACT<1:N>. The bank active signal generation circuit 23 may generate the bank active signals BANK_ACT<1:N which are enabled according to the pulse of the active pulse ACTP and are disabled according to the pulse of the delayed active pulse ACTPD in the state in which preset banks have been accessed by the bank access signals BA<1:N>.

Figure 3:
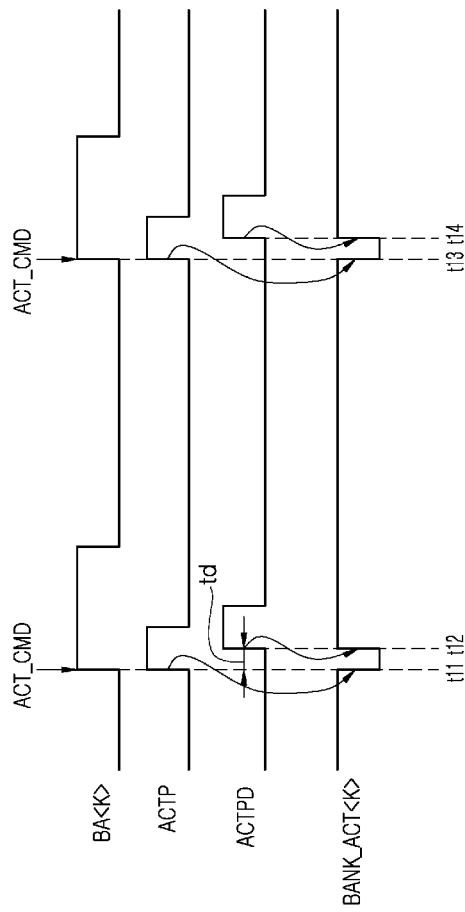
FIG. 3 is a timing diagram representation of an example for explaining an operation of a semiconductor system illustrated in FIG. 1.

The operation of the semiconductor system as described above will be described with reference to FIG. 3 below.

When a K$^{th}$ bank (not illustrated) is accessed by the bank access signal BA<k> enabled to a logic high level and the active command ACT_CMD is generated at a time point t11, a first pulse of the active pulse ACTP for the K$^{th}$ bank (not illustrated) is generated. At a time point t12, the first pulse of the active pulse ACTP is delayed by a delay period td, so that a first pulse of the delayed active pulse ACTPD is generated. The bank active signals BANK_ACT<1:N> are disabled in synchronization with the first pulse of the active pulse ACTP at the time point t11 and are enabled in synchronization with the first pulse of the delayed active pulse ACTPD at the time point t12.

When the K$^{th}$ bank (not illustrated) is accessed by the bank access signal BA<k> enabled to a logic high level and the active command ACT_CMD is generated at a time point t13, a second pulse of the active pulse ACTP for the K$^{th}$ bank (not illustrated) is generated. At a time point t14, the second pulse of the active pulse ACTP is delayed by the delay period td, so that a second pulse of the delayed active pulse ACTPD is generated. The bank active signals BANK_ACT<1:N> are disabled in synchronization with the second pulse of the active pulse ACTP at the time point t13 and are enabled in synchronization with the second pulse of the delayed active pulse ACTPD at the time point t14.

As described above, in the semiconductor system in accordance with an embodiment, when an active operation is performed for an accessed bank, a precharge operation is performed for the accessed bank during only a period from the time point at which the active pulse ACTP is generated to the time point at which the delayed active pulse ACTPD is generated. That is, the semiconductor system in accordance with an embodiment can decrease a precharge operation period for a cell block or a bank and increase an active operation period, thereby sufficiently ensuring a write recovery time.

Figure 4:
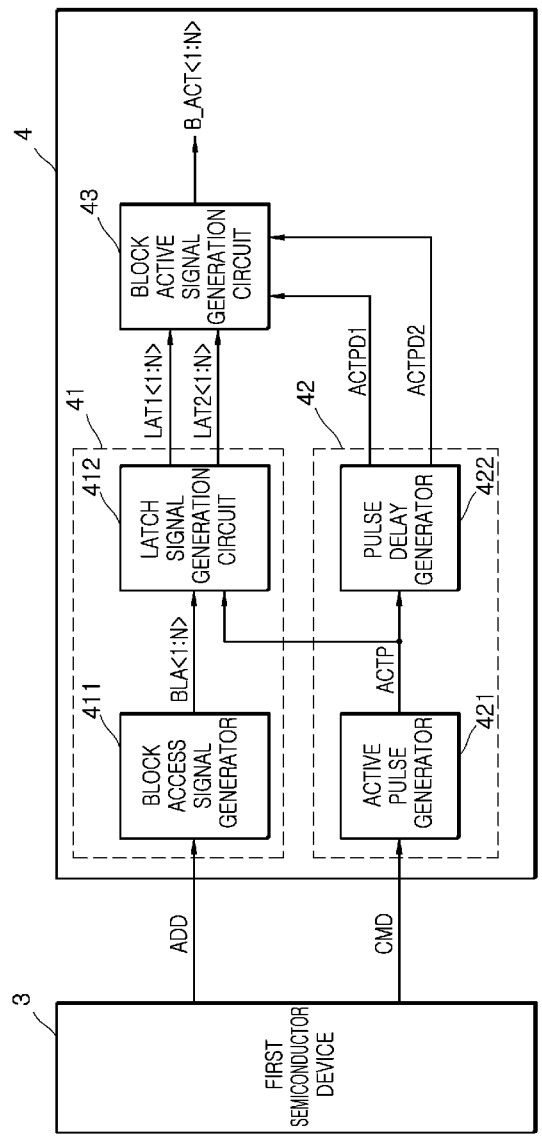
FIG. 4 is a block diagram illustrating a representation of an example of a configuration of a semiconductor system in accordance with an embodiment.

Referring to FIG. 4, a semiconductor system in accordance with an embodiment may include a first semiconductor device 3 and a second semiconductor device 4.

The first semiconductor device 3 may apply an address ADD and a command CMD to the second semiconductor device 4. In an embodiment, the address ADD and the command CMD are illustrated to be transmitted through separate lines, but may also be implemented to be transmitted through substantially the same line in accordance with embodiments.

The second semiconductor device 4 may include an address processor 41, a command processor 42, and a block active signal generation circuit 43.

The address processor 41 may generate first latch signals LAT1<1:N> and second latch signals LAT2<1:N> in response to the address ADD and an active pulse ACTP. For example, the address processor 41 may generate the first latch signals LAT1<1:N> and the second latch signals LAT2<1:N> which are sequentially enabled in response to the active pulse ACTP in the state in which a preset block (not illustrated) has been accessed according to the address ADD. Logic levels, at which the first latch signals LAT1<1:N> and the second latch signals LAT2<1:N> are enabled, may be variously set in accordance with embodiments. The address ADD may be implemented as a signal including a plurality of bits in accordance with embodiments.

The command processor 42 may receive the command CMD to generate the active pulse ACTP, a first delayed active pulse ACTPD1, and a second delayed active pulse ACTPD2. The active pulse ACTP may include a pulse which is generated for an active operation for blocks accessed by block access signals BLA<1:N>. The first delayed active pulse ACTPD1 and the second delayed active pulse ACTPD2 may be respectively generated by delaying the active pulse ACTP by a preset delay period.

The block active signal generation circuit 43 may generate block active signals B_ACT<1:N> in order to perform the active operation for the blocks accessed by the block access signals BLA<1:N>. The block active signal generation circuit 43 may generate the block active signals B_ACT<1:N> in response to the first latch signals LAT1<1:N>, the second latch signals LAT2<1:N>, the first delayed active pulse ACTPD1, and the second delayed active pulse ACTPD2. More configurations and operations of the block active signal generation circuit 43 will be described later with reference to FIG. 6.

The address processor 41 may include a block access signal generator 411 and a latch signal generation circuit 412. The block access signal generator 411 may decode the address ADD to generate the block access signals BLA<1:N>. Logic level combinations of the block access signals BLA<1:N> may be set in order to access blocks included in the second semiconductor device 4. The blocks may be implemented to be included in a bank and the number of blocks included in the bank may be variously set in accordance with embodiments. It may be preferable that a bit number "N" of the block access signals BLA<1:N> is decided according to the number of blocks. In an embodiment, an example, in which the address processor 41 decodes the address ADD to generate the block access signals BLA<1:N> in order to access a block, has been described; however, the address processor 41 may also be implemented to generate a signal for accessing a bank in accordance with embodiments. The latch signal generation circuit 412 may shift the block access signals BLA<1:N> in response to the active pulse ACTP and sequentially generate the first latch signals LAT1<1:N> and the second latch signals LAT2<1:N>.

The command processor 42 may include an active pulse generator 421 and a pulse delay generator 422. The active pulse generator 421 may decode the command CMD to generate the active pulse ACTP including pulses generated in order to perform the active operation. The active pulse ACTP may include a pulse corresponding to the number of times by which an active command for the active operation is inputted. The pulse delay generator 422 may generate the first delayed active pulse ACTPD1 by delaying the active pulse ACTP by a first delay period and generate the second delayed active pulse ACTPD2 by delaying the active pulse ACTP by a second delay period. The first and second delay periods may be variously set in accordance with embodiments.

Figure 5:
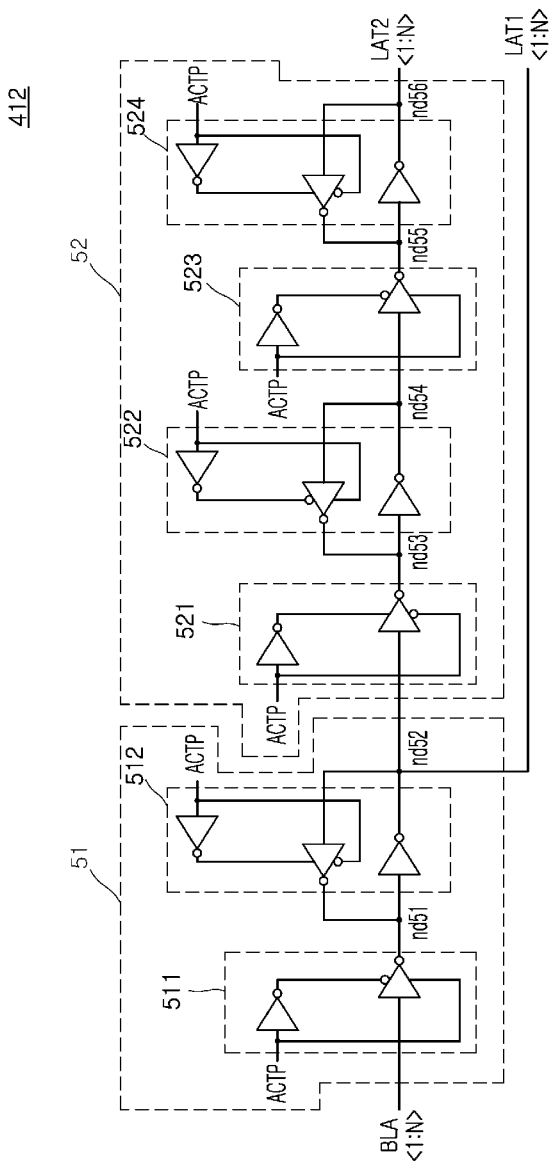
FIG. 5 is a circuit diagram representation of an example in accordance with an embodiment of a latch signal generation circuit included in a semiconductor system illustrated in FIG. 4.

Referring to FIG. 5, the latch signal generation circuit 412 may include a first shifting circuit 51 and a second shifting circuit 52.

The first shifting circuit 51 may include a first transfer circuit 511 and a first latch circuit 512. The first transfer circuit 511 transfers the block access signals BLA<1:N> to a node nd51 when the active pulse ACTP is generated to a logic high level. The first latch circuit 512 inverts and buffers a signal of the node nd51 and outputs the buffered signal to a node nd52. When the active pulse ACTP is generated to a logic low level, the first latch circuit 512 may latch the signal of the node nd51 and a signal of the node nd52. When a first pulse of the active pulse ACTP is generated, the first shifting circuit 51 may output the block access signals BLA<1:N> as the first latch signals LAT1<1:N> through the first transfer circuit 511 and the first latch circuit 512.

The second shifting circuit 52 may include a second transfer circuit 521, a second latch circuit 522, a third transfer circuit 523, and a third latch circuit 524. The second transfer circuit 521 transfers the signal of the node nd52 to a node nd53 when the active pulse ACTP is generated to a logic low level. The second latch circuit 522 inverts and buffers a signal of the node nd53 and outputs the buffered signal to a node nd54. When the active pulse ACTP is generated to a logic high level, the second latch circuit 522 may latch the signal of the node nd53 and a signal of the node nd54. When the active pulse ACTP is generated to the logic high level, the third transfer circuit 523 transfers the signal of the node nd54 to a node nd55. The third latch circuit 524 inverts and buffers a signal of the node nd55 and outputs the buffered signal to a node nd56. When the active pulse ACTP is generated to the logic low level, the third latch circuit 524 may latch the signal of the node nd55 and a signal of the node nd56. When a second pulse of the active pulse ACTP is generated, the second shifting circuit 52 may output the block access signals BLA<1:N> as the second latch signals LAT2<1:N> through the first transfer circuit 511, the first latch circuit 512, the second transfer circuit 521, the second latch circuit 522, the third transfer circuit 523, and the third latch circuit 524.

Figure 6:
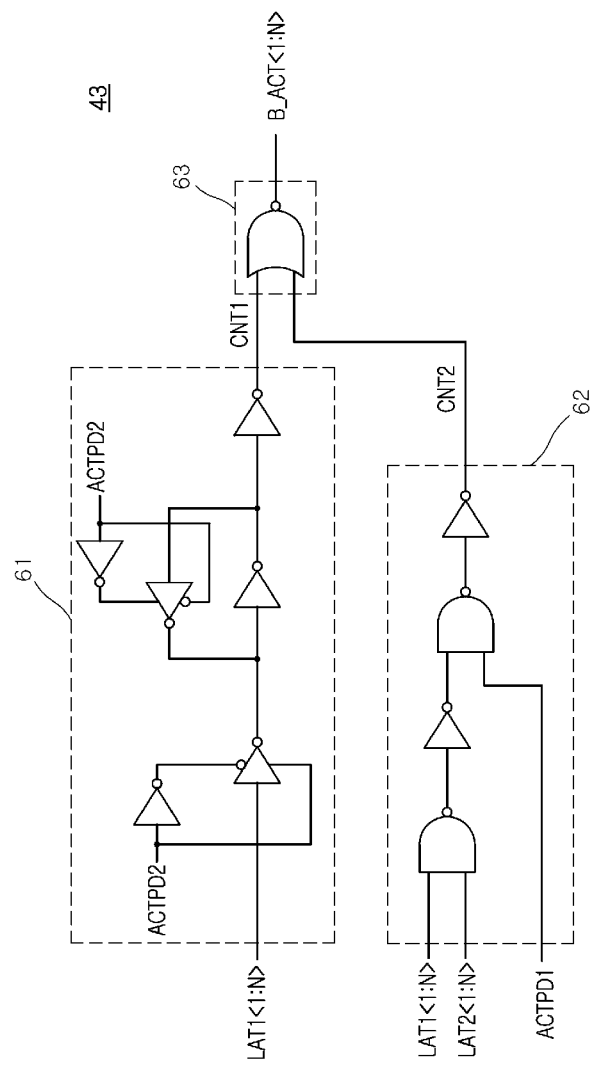
FIG. 6 is a circuit diagram representation of an example in accordance with an embodiment of a block active signal generation circuit included in a semiconductor system illustrated in FIG. 4.

Referring to FIG. 6, the block active signal generation circuit 43 may include a first control signal generation circuit 61, a second control signal generation circuit 62, and a signal combination circuit 63.

The first control signal generation circuit 61 may generate a first control signal CNT1 in response to the first latch signals LAT1<1:N> and the second delayed active pulse ACTPD2. For example, when the second delayed active pulse ACTPD2 is generated to a logic high level, the first control signal generation circuit 61 may invert and buffer the first latch signals LAT1<1:N> to generate the first control signal CNT1.

The second control signal generation circuit 62 may generate a second control signal CNT2 in response to the first latch signals LAT1<1:N>, the second latch signals LAT2<1:N>, and the first delayed active pulse ACTPD1. For example, in the state in which the first latch signals LAT1<1:N> and the second latch signals LAT2<1:N> are all at a logic high level, the second control signal generation circuit 62 may buffer the first delayed active pulse ACTPD1 to generate the second control signal CNT2.

The signal combination circuit 63 may combine the first control signal CNT1 with the second control signal CNT2 to generate the block active signals B_ACT<1:N>. For example, when the first control signal CNT1 and the second control signal CNT2 are all at a logic low level, the signal combination circuit 63 may generate the block active signals B_ACT<1: N> which are enabled to a logic high level. When at least one of the first control signal CNT1 and the second control signal CNT2 is at a logic high level, the signal combination circuit 63 may generate the block active signals B_ACT<1:N> which are disabled to a logic low level.

Figure 7:
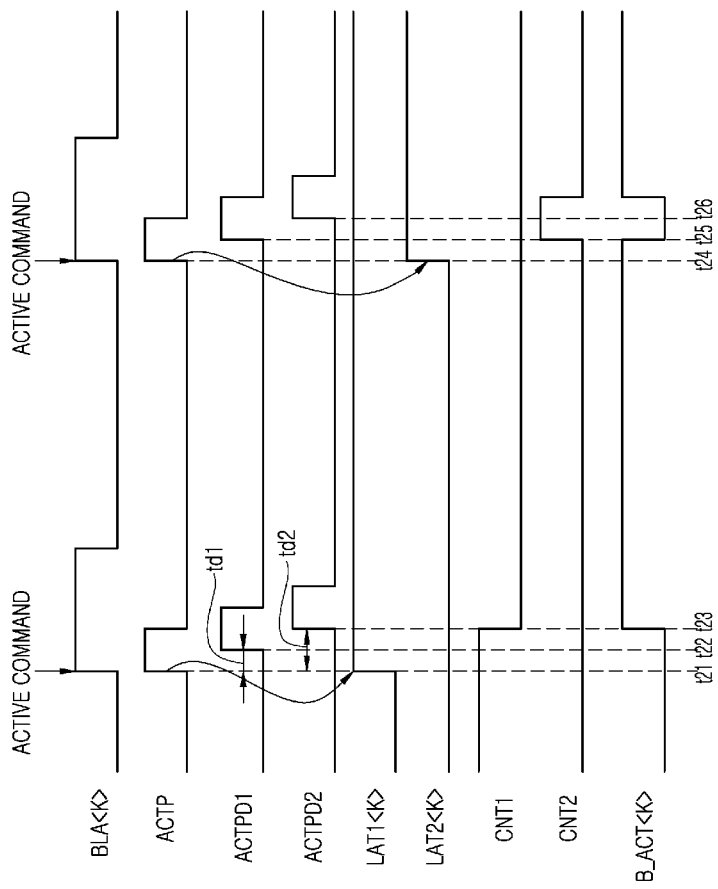
FIG. 7 is a timing diagram representation of an example for explaining an operation of a semiconductor system illustrated in FIG. 4.

The operation of the semiconductor system described with reference to FIG. 4 to FIG. 6 will be described with reference to FIG. 7 is below.

When a $K^{th}$ bank (not illustrated) is accessed by the block access signal BLA<k> enabled to a logic high level and the active command ACTIVE COMMAND is generated at a time point t21, a first pulse of the active pulse ACTP for the $K^{th}$ bank (not illustrated) is generated. At a time point t22, the first pulse of the active pulse ACTP is delayed by a first delay period td1, so that a first pulse of the first delayed active pulse ACTPD1 is generated. At a time point t23, the first pulse of the active pulse ACTP is delayed by a second delay period td2, so that a first pulse of the second delayed active pulse ACTPD2 is generated. The block active signals B_ACT<1:N> are enabled to a logic high level by the first control signal CNT1 at a logic low level generated by inverting and buffering the first latch signals LAT1<1:N> and the second control signal CNT2 substantially maintaining a logic low level from at a time point t23 at which the first pulse of the second delayed active pulse ACTPD2 is generated.

When the $K^{th}$ bank (not illustrated) is accessed by the block access signal BLA<k> enabled to a logic high level and the active command ACTIVE COMMAND is generated at a time point t24, a second pulse of the active pulse ACTP for the $K^{th}$ bank (not illustrated) is generated. At a time point t25, the second pulse of the active pulse ACTP is delayed by the first delay period td1, so that a second pulse of the first delayed active pulse ACTPD1 is generated. At a time point t26, the second pulse of the active pulse ACTP is delayed by the second delay period td2, so that a second pulse of the second delayed active pulse ACTPD2 is generated. The block active signals B_ACT<1:N> are disabled to a logic low level in the period of t25 to t26 by the first control signal CNT1 substantially maintaining a logic low level and the second control signal CNT2 generated by inverting and buffering the second pulse of the first delayed active pulse ACTPD1.

As described above, in the semiconductor system in accordance with an embodiment, when an active operation is performed from the time point at which a first active operation is performed for an accessed block to the time point at which a second active operation is performed, and a precharge operation is performed during only a preset period from the time point at which the second active operation is performed. That is, the semiconductor system in accordance with an embodiment can decrease a precharge operation period for a cell block or a bank and increase an active operation period, thereby sufficiently ensuring a write recovery time.

The aforementioned semiconductor devices and semiconductor systems described with reference to FIG. 1 to FIG. 7 may be applied to an electronic system including a memory system, a graphic system, a computing system, a mobile system and the like. For example, referring to FIG. 8, an electronic system 1000 in accordance with an embodiment may include a data storage 1001, a memory controller 1002, a buffer memory 1003, and an input/output interface 1004.

The data storage 1001 stores data applied from the memory controller 1002 according to a control signal from the memory controller 1002, reads the stored data, and outputs the read data to the memory controller 1002. The data storage 1001 may include the second semiconductor device 2 illustrated in FIG. 1 or the second semiconductor device 4 illustrated in FIG. 4. The data storage 1001 may include a nonvolatile memory capable of continuously storing data without loss although power is off. The nonvolatile memory may be implemented with a flash memory (a NOR Flash Memory and a NAND Flash Memory), a phase change memory (Phase Change Random Access Memory; PRAM), a resistive memory (Resistive Random Access Memory; RRAM), a spin transfer torque random access memory (STTRAM), or a magnetic memory (Magnetic Random Access Memory; MRAM).

The memory controller 1002 decodes a command applied from an external device (a host device) through the input/output interface 1004, and controls data input/output for the data storage 1001 and the buffer memory 1003 according to the decoded result. The memory controller 1002 may include the first semiconductor device 1 illustrated in FIG. 1 or the first semiconductor device 3 illustrated in FIG. 4.

Figure 8:
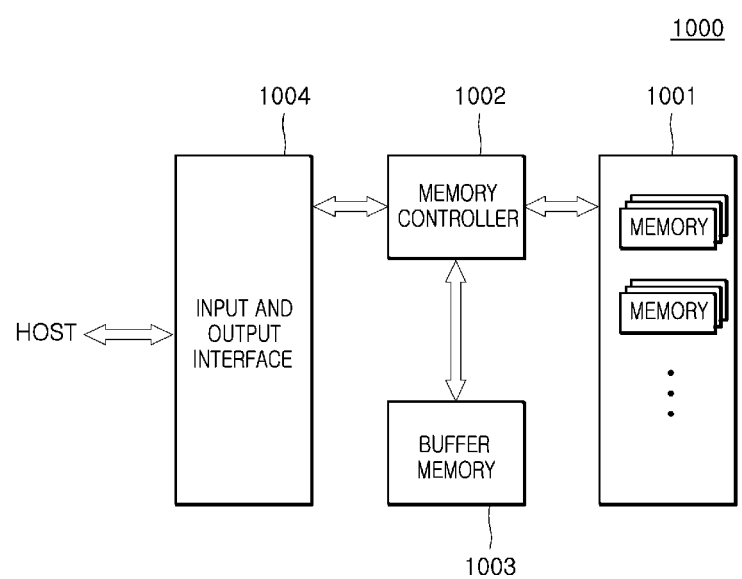
FIG. 8 is a diagram illustrating a representation of an example of a configuration in accordance with an embodiment of an electronic system to which a semiconductor device and a semiconductor system illustrated in FIG. 1 to FIG. 7 have been applied.

Referring to FIG. 8, the memory controller 1002 is illustrated as one block, but may include a controller for controlling the data storage 1001 independent of a controller for controlling the buffer memory 1003.

The buffer memory 1003 may temporarily store data to be processed in the memory controller 1002, that is, data which is inputted/outputted to/from the data storage 1001. The buffer memory 1003 may store data DATA, which is applied from the memory controller 1002, according to the control signal. The buffer memory 1003 reads the stored data and outputs the read data to the memory controller 1002. The buffer memory 1003 may include a volatile memory such as a DRAM (Dynamic Random Access Memory), a mobile DRAM, and a SRAM (Static Random Access Memory).

The input/output interface 1004 provides a physical connection between the memory controller 1002 and the external device (the host), thereby allowing the memory controller 1002 to receive a control signal for data input/output from the external device and to exchange data with the external device. The input/output interface 1004 may include one of various interface protocols such as a USB, a MMC, a PCI-E, a SAS, a SATA, a PATA, a SCSI, an ESDI, and an IDE.

The electronic system 1000 may be used as an auxiliary storage device or an external storage device of the host device. The electronic system 1000 may include a solid state disk (SSD), a USB memory (Universal Serial Bus Memory), a secure digital card (SD), a mini secure digital card (mSD), a micro secure digital card (micro SD), a high capacity secure digital card (Secure Digital High Capacity; SDHC), a memory stick card, a smart media card (SM), a multi-media card (MMC), an embedded multi-media card (eMMC), a compact flash card (CF) and the like.

While various embodiments have been described above, it will be understood to those skilled in the art that the embodiments described are by way of example only. Accordingly, the semiconductor devices and the semiconductor systems described herein should not be limited based on the described embodiments.

What is claimed is:

1. A semiconductor device comprising:
a command processor configured to decode a command to generate an active pulse and a delayed active pulse; and
a bank active signal generation circuit configured to generate a bank active signal for performing an active operation for a bank accessed by an address,
wherein the bank active signal is disabled in synchronization with the active pulse and is enabled in synchronization with the delayed active pulse, and
wherein the delayed active pulse is generated by delaying the active pulse.

2. The semiconductor device of claim 1, wherein the command processor comprises:
a command decoder configured to decode the command to generate an active command, the active command enabled for the active operation.

3. The semiconductor device of claim 2, wherein the command processor comprises:
a pulse generator configured to generate an active pulse including a pulse generated when the active command is enabled; and
a pulse delay generator configured to generate the delayed active pulse by delaying the active pulse.

4. The semiconductor device of claim 1, wherein the semiconductor device comprises:
an address decoder configured to decode the address to generate a bank access signal, the bank access signal enabled in order to access the bank.

5. The semiconductor device of claim 1, wherein the bank active signal generation circuit comprises:
a pull-up driving circuit configured to pull-up drive an internal node in response to a bank access signal and the active pulse; and
a pull-down driving circuit configured to pull-down drive the internal node in response to the bank access signal and the delayed active pulse.

6. The semiconductor device of claim 5, wherein the bank active signal generation circuit comprises:
a pull-up signal generation circuit configured to perform a logic operation on the bank access signal and the active pulse to output a pull-up signal; and
a latch output circuit coupled to the internal node and configured to latch, invert, and buffer a signal of a signal of the internal node to generate the bank active signal, and
wherein the pull-up driving circuit is configured to pull-up drive the internal node in response to the pull-up signal.

7. A semiconductor device comprising:
a command processor configured to decode a command to generate an active pulse, a first delayed active pulse, and a second delayed active pulse; and
a block active signal generation circuit configured to generate a block active signal in response to the active pulse in a state in which a preset block has been accessed; and
an address processor configured to generate a first latch signal, which is enabled in response to a first occurrence of the active pulse, and a second latch signal, which is enabled in response to a second occurrence of the active pulse, after the preset block is accessed in response to an address,
wherein the block active signal is enabled in response to the first occurrence of the active pulse and is disabled in response to the second occurrence of the active pulse.

8. The semiconductor device of claim 7, wherein the command processor comprises:
an active pulse generator configured to decode the command to generate the active pulse for an active operation; and
a pulse delay generator configured to generate the first delayed active pulse and the second delayed active pulse by delaying the active pulse.

9. The semiconductor device of claim 7, wherein the address processor comprises:
a block access signal generator configured to decode the address to generate a block access signal, the block access signal enabled in order to access the block; and
a latch signal generation circuit configured to generate the first latch signal and the second latch signal in response to the block access signal and the active pulse.

10. The semiconductor device of claim 7, wherein the first delayed active pulse is generated by delaying the active pulse by a first delay period, and the second delayed active pulse is generated by delaying the active pulse by a second delay period, wherein the second delay period is set to be greater than the first delay period.

11. The semiconductor device of claim 7, wherein a first occurrence of the first delayed active pulse is generated by delaying the first occurrence of the active pulse by a first delay period, a second occurrence of the first delayed active pulse is generated by delaying the second occurrence of the active pulse by the first delay period, a first occurrence of the second delayed active pulse is generated by delaying the first occurrence of the active pulse by a second delay period, and a second occurrence of the second delayed active pulse is generated by delaying the second occurrence of the active pulse by the second delay period.

12. The semiconductor device of claim 11, wherein the block active signal is enabled in synchronization with the first occurrence of the second delayed active pulse and is disabled by a period in which the second occurrence of the first delayed active pulse is generated.

13. The semiconductor device of claim 7, wherein the block active signal generation circuit comprises:
a first control signal generation circuit configured to buffer a first latch signal in response to the second delayed active pulse and generate a first control signal;
a second control signal generation circuit configured to buffer the first delayed active pulse in response to the first latch signal and a second latch signal, and generate a second control signal; and
a signal combination circuit configured to generate the block active signal in response to the first control signal and the second control signal.

14. A semiconductor system comprising:
a first semiconductor device configured to output an address and a command; and
a second semiconductor device configured to generate a block active signal in response to an active pulse generated by decoding the command in a state in which a preset block has been accessed in response to the address,
wherein the block active signal is enabled in response to a first occurrence of the active pulse and is disabled in response to a second occurrence of the active pulse, and
wherein the second semiconductor device comprises:
an address processor configured to generate a first latch signal, which is enabled in response to the first occurrence of the active pulse, and a second latch signal, which is enabled in response to the second occurrence of the active pulse, after the preset block is accessed in response to the address.

15. The semiconductor system of claim 14, wherein the second semiconductor device comprises:
an active pulse generator configured to decode the command to generate the active pulse for an active operation; and
a pulse delay generator configured to generate a first delayed active pulse and a second delayed active pulse by delaying the active pulse.

16. The semiconductor system of claim 14, wherein the address processor comprises:
a block access signal generator configured to decode the address to generate a block access signal which is enabled in order to access the block; and
a latch signal generation circuit configured to generate the first latch signal and the second latch signal in response to the block access signal and the active pulse.

17. The semiconductor system of claim 14, wherein a first occurrence of a first delayed active pulse is generated by delaying the first occurrence of the active pulse by a first delay period, a second occurrence of the first delayed active pulse is generated by delaying the second occurrence of the active pulse by the first delay period, a first occurrence of a second delayed active pulse is generated by delaying the first occurrence of the active pulse by a second delay period, and a second occurrence of the second delayed active pulse is generated by delaying the second occurrence of the active pulse by the second delay period.

18. The semiconductor system of claim 17, wherein the block active signal is enabled in synchronization with the first occurrence of the second delayed active pulse and is disabled by a period in which the second occurrence of the first delayed active pulse is generated.

19. The semiconductor system of claim 14, wherein the second semiconductor device comprises:
a first control signal generation circuit configured to buffer a first latch signal in response to the second delayed active pulse and generate a first control signal;
a second control signal generation circuit configured to buffer the first delayed active pulse in response to the first latch signal and a second latch signal, and generate a second control signal; and
a signal combination circuit configured to generate the block active signal in response to the first control signal and the second control signal.

20. A semiconductor device comprising:
a command processor configured to decode a command to generate an active pulse and a delayed active pulse; and
a bank active signal generation circuit configured to generate a bank active signal for performing an active operation for a bank accessed by an address,
wherein when the active operation is performed for an accessed bank, a percharge operation is performed for the accessed bank during only a period from a time at which the active pulse is generated to a time at which the delayed active pulse is generated, and
wherein the delayed active pulse is generated by delaying the active pulse.

21. A semiconductor device comprising:
a command processor configured to decode a command to generate an active pulse, a first delayed active pulse, and a second delayed active pulse, wherein each of the first delayed active pulse and second delayed active pulse is generated by delaying the active pulse, and the active pulse indicates the start of performing an active operation; and
a block active signal generation circuit configured to generate a block active signal in response to the active pulse in a state in which a preset block has been accessed,
wherein when a second active operation is to be performed for an accessed block immediately after a first active operation has completed being performed for the accessed block a precharge operation is performed during only a preset period starting from the time at which the second active operation starts to be performed.

* * * * *